United States Patent [19]

Reymond

[11] 3,982,949

[45] Sept. 28, 1976

[54] HALF-TONE SCREEN MAKING BY DECAPITATION OF SUBSTRATE PROJECTIONS

[76] Inventor: Edgard Reymond, Le Manoir, 1441 Montagny, Switzerland

[22] Filed: Aug. 6, 1975

[21] Appl. No.: 602,444

[30] Foreign Application Priority Data
Aug. 30, 1974 Switzerland.................... 11827/74

[52] U.S. Cl.................................. 96/116; 96/38; 96/45; 96/117; 264/1
[51] Int. Cl.²........................................ G03F 5/00
[58] Field of Search .............. 96/38, 45, 116, 117, 96/118; 264/1

[56] References Cited
UNITED STATES PATENTS

| | | | |
|---|---|---|---|
| 2,295,632 | 9/1942 | Buskes | 96/116 |
| 2,543,013 | 2/1951 | Glassey | 96/116 |
| 2,767,093 | 10/1956 | Bilhoefer | 96/116 |
| 2,854,337 | 9/1958 | Pearson | 96/116 |
| 2,959,484 | 11/1960 | Marx | 96/116 |
| 2,961,315 | 11/1960 | Stirling | 96/116 |
| 3,739,455 | 6/1973 | Alvarez | 264/1 |
| 3,749,471 | 7/1973 | Mallard | 264/1 |
| 3,810,804 | 5/1974 | Rowland | 264/1 |
| 3,839,514 | 10/1974 | Nauta | 264/1 |
| 3,893,795 | 7/1975 | Nauta | 264/1 |

OTHER PUBLICATIONS

Flader et al., "Modern Photoengraving," 209–212, 10/49.
Mertle et al., "Photomechanics and Printing," 8/58, 3–6.

*Primary Examiner*—Edward C. Kimlin
*Attorney, Agent, or Firm*—Robert E. Burns; Emmanuel J. Lobato; Bruce L. Adams

[57] ABSTRACT

A half-tone screen comprises a transparent or opaque sheet having an uneven face with a multitude of projections thereon coated with a paint or varnish of contrasting color. By scraping, the coating material is removed and the projections decapitated to a selected degree to provide desired progressive shading effects.

19 Claims, 3 Drawing Figures

HALF-TONE SCREEN MAKING BY DECAPITATION OF SUBSTRATE PROJECTIONS

The invention relates to the graphic arts and is particularly concerned with half-tone screens used for example in drawing and printing.

Such half-tone screens are useful for producing different shades of gray, for example, with various shading and pictorial effects, using photocomposition methods.

Up to now, use has been made of half-tone screens formed by a transparent sheet carrying an array of printed or photographically-developed lines or dots, the shade of gray produced depending on the given width and spacing of the lines or dots. These sheets can be used individually to produce a specific regular shade, or can be superimposed on one another and oriented to produce a composite effect.

However, the uses of such half-tone screens are limited. Even when superimposing several screens, difficulties can be encountered in matching two shades. Also these screens do not always enable a precisely desired design or effect to be obtained.

An object of the invention is therefore to provide a novel form of half-tone screen which can be used to easily and rapidly provide effects which were unobtainable or more difficult to obtain with the prior types of screen, and which in particular enables various progressively-variable shades to be obtained at will in a desired configuration.

The invention therefore proposes a half-tone screen comprising a sheet of first material having an uneven face which in cross-section has a multitude of projections placed close to one another, each projection having an apex and being of progressively decreasing width up to the apex, said uneven face being covered at least partially with a second material having different light-absorbtion properties to the first material, the first and second materials being removable by decapitation of said projections to selectively uncover the first material for the provision of selected half-tone effects.

The second material may entirely cover the uneven face of the sheet of first material, and be partly removed by the user, or can be applied by the user over a selected part of said sheet and then partly removed to provide the desired effects.

The invention thus covers both a coated sheet of first material as defined, or such an uncoated sheet in combination with a second material such as a paint or varnish applicable by the user on the uneven face of the sheet and then selectively removable as set out above.

The degree of shading produced at any point on a prepared screen depends upon the amount of material removed, i.e. the amount by which each projection is decapitated. By selectively removing material, the user can thus provide varied shading effects in any desired configuration.

In an embodiment for use in photographis composition, the first material is transparent and the second material is colored and transparent only to inactinic light so that the user can see through the screen to accurately place it on a design or other piece of work. When the screen is placed on a photosensitive plate, only those parts of the plate corresponding to parts of the screen not covered by the second material become activated.

In other embodiments, the screen can be opaque, the first material being of dark color and second material of light color, or vice versa.

Embodiments of the invention will now be described, by way of example, with reference to the accompanying schematic drawings, in which.

Figure 1:
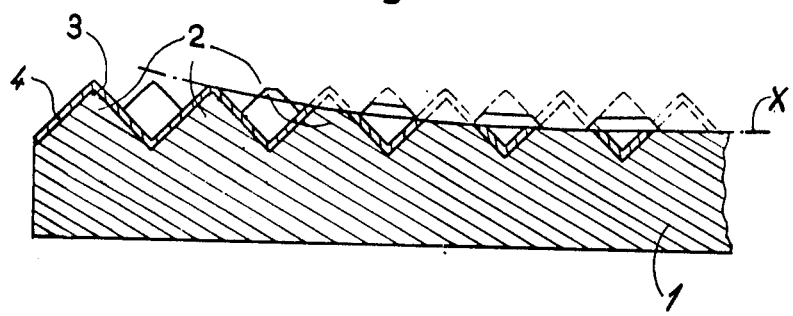
FIG. 1 is a cross-section through a half-tone screen according to the invention, shown on a greatly enlarged scale.

The screen of FIG. 1 comprises a supporting sheet 1 of flexible or rigid transparent plastic material. The term plastic is used in a broad sense to designate both synthetic and natural malleable materials, such as synthetic resins or gelatin. One of the faces of sheet 1 is uneven and has a regular array of identical projections 2 formed by stamping or molding. According to the manufacturing process used the projections 2 could be provided on both faces of sheet 1, with projections on one face corresponding to hollows on the other face.

In cross-section, in a plane perpendicular to the sheet and passing through the apex 3 of a projection, the projections 2 have a triangular or closely triangular profile. In the example given, projections 2 are pyramid-shaped. They could of course have other regular shapes, for example conical or prisms of triangular cross-section. In the case of triangular prisms, the elongate summits of the prisms can be rectilinear or curved and disposed parallel to one another, or arranged in crossing formation. It is also possible to form the projections by providing a spiral groove somewhat in the manner of a groove in a phonograph disc. The projections may also be formed with irregular bases, and be of random shape, forming for example a granular surface. Many forms of projections are thus possible within the limits of the tools available and the possible methods for forming dies.

The uneven face of plate 1 is covered by an uniform layer 4 of a second colored transparent or opaque material, for example a varnish, paint or a suitable plastic material, preferably having exactly or substantially the same hardness as the first material. The second material is advantageously transparent only to inactinic light so that when the finished screen is used in a photoprinting or photocomposition process, the parts of the photographic film under a covered part of sheet 1 will not be activated.

The plate 1 may be entirely precoated with layer 4, or the layer 4 may be applied by the user when preparing the screen for use, and the user may decide which part(s) of the surface have to be coated according to the effects desired, e.g. when only a part of a drawing or design is to be shaded in half-tone.

The layer 4 applied to sheet 1 may as shown have a uniform thickness covering the projections 2, or could completely embed the projections 2 and have a smooth outer face approximately flush with the apices 3.

By scraping the uneven face covered with layer 4 to a greater or lesser depth to remove material be decapitation of the projections 2, for example as indicated by chain line X, part of the material of sheet 1 becomes visible. The deeper the removal, the more of the transparent first material appears.

Figure 2:
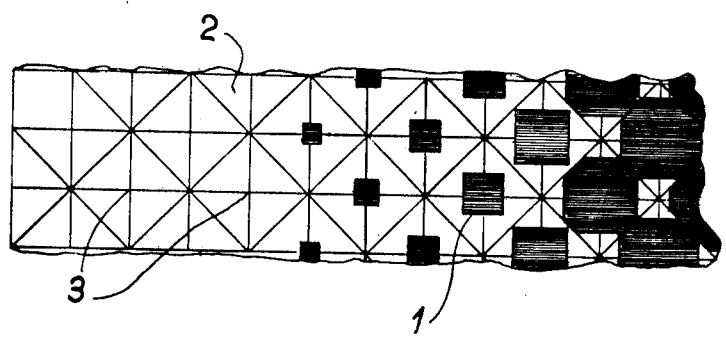
FIG. 2 is a plan view of the screen of FIG. 1.

When the finished screen is placed on a substrate (. e.g. a plain sheet contrasting with the color of layer 4, or a design) part of the substrate is thus visible through the parts of the screen from which layer 4 has been removed, as shown schematically in FIG. 2, to produce a visible progressive shading effect.

The finished screen may also be placed on a sensitized photographic paper; when exposed, only the parts of the photographic paper underlying parts of the screen from which layer 4 has been removed are activated. A progressive shading effect is thus produced on the developed photograph or negative, e.g. black where the layer 4 was intact, and white where the layer 4 was completely removed, with progressive intermediate shades of gray.

The screen is thus useful in the graphic arts for shading any graphical design with selected shades of varying tones. It can be used on a luminous or non-luminous table. For example, an artist applies a bare sheet 1 on a drswing, then covers selected parts of the upper uneven face of sheet 1 (corresponding to parts of the drawing to be shaded) with a suitable varnish which is transparent only to inactinic light. After drying of the varnish, material is selectively removed by scraping to produce the desired shading effects. Then a photograph is taken of the drawing covered with the finished screen, this photograph perfectly reproducing the selected shading.

For convenience, the plane underside of sheet 1 may be coated with an adhesive covered with a removable protective sheet, which is removed just prior to use to enable sticking of the screen onto a surface.

It is also possible to juxtapose screens of different texture (i.e. having different types of projections) on one and the same drawing to produce a great variety of effects.

To directly produce half-tone effects for completing illustrations or advertising material, a n opaque sheet 1 of given color, for example black, is used. On the uneven face this sheet is applied an even layer of a second opaque material of contrasting color, for example white. By scraping off a variable thickness of material, the lower black material becomes progressively visible as schematically indicated in FIG. 2, the shade produced depending on the amount of material removed. The sheet and covering layer can of course have any suitable contrasting colors.

Figure 3:
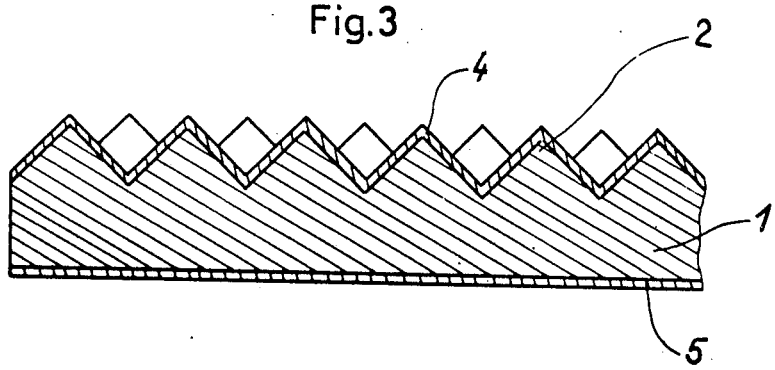
FIG. 3 is a cross-section through another embodiment of half-tone screen.

In another embodiment, shown in FIG. 3, a transparent sheet 1 with projections 2 defining an uneven face has its uneven face covered with a layer 4 of a first colored material, for example black or white, and its smooth rear face covered with a layer 5 of a second colored material, for example white or black. By partial removal of material 4 and projections 2, the layer 5 is made selectively visible. As before, layer 4 may be uniform and follow the outline of projections 2, or can embed the projections 2 to form a smooth upper face. Hence, the same transparent sheet 1 can be used to produce a transparent screen (as in FIG. 1) or an opaque screen (as in FIG. 3).

What is claimed is:

1. A method of producing a screen with selected half-tone effects comprising providing a sheet of first material having an uneven face which in cross-section has a multitude of projections placed close to one another, each projection having an apex and being of progressively decreasing width up to the apex, said uneven face being covered at least partially with a second material having different light-absorbtion properties to the first material, and removing the first and second materials by decapitation of said projections to a greater depth at some areas than at other areas to selectively uncover the first material for the provision of said selected half-tone effects.

2. The method according to claim 1, in which said first material is transparent and said second material is a colored material transparent only to inactinic light.

3. The method according to claim 1, in which said sheet of first material is flexible.

4. The method according to claim 1, in which said sheet has a smooth second face opposite said uneven face, and comprising a layer of adhesive on said second face.

5. The method according to claim 1, in which said projections each have a regularly shaped base.

6. The method according to claim 1, in which the projections are pyramid-shaped.

7. The method according to claim 1, in which the projections are conical.

8. The method according to claim 1, in which the projections are prisms of triangular cross-section, each prism having an elongate summit forming said apex.

9. The method according to claim 1, in which said apex-forming summits of different prisms are rectilinear and parallel to one another.

10. The method according to claim 1, in which said apex-forming summits of different prisms are curved and parallel to one another.

11. The method according to claim 1, in which said projections have irregular bases.

12. The method according to claim 1, in which said projections form a granulated surface.

13. The method according to claim 1, in which said first material is a synthetic resin.

14. The method according to claim 1, in which said first material is gelatine, and the second material a varnish.

15. The method according to claim 1, in which said first material is opaque and of a dark color and the second material is opaque and of a light color.

16. The method according to claim 1, in which said first material is opaque and of a light color and the second material is opaque and of a dark color.

17. The method according to claim 1, in which said second material is applied as a layer of uniform thickness on said projections.

18. The method according to claim 1, in which said projections are embedded in the second material which has a smooth outer face.

19. The method according to claim 1, in which said first material is transparent and the second material is opaque and of a given color, said sheet having a smooth second face opposite said uneven face, said second face being coated with a layer of an opaque thire material having a color contrasting with said given color of the second material.

* * * * *